(12) United States Patent
Lin et al.

(10) Patent No.: US 8,040,734 B2
(45) Date of Patent: Oct. 18, 2011

(54) CURRENT-MODE SENSE AMPLIFYING METHOD

(75) Inventors: Yung-Feng Lin, Dasi Township, Taoyuan County (TW); Chun-Yi Lee, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 12/767,418

(22) Filed: Apr. 26, 2010

(65) Prior Publication Data

US 2010/0202213 A1 Aug. 12, 2010

Related U.S. Application Data

(62) Division of application No. 11/970,545, filed on Jan. 8, 2008, now Pat. No. 7,724,595.

(51) Int. Cl.
*G11C 11/34* (2006.01)
(52) U.S. Cl. ............ 365/185.21; 365/210; 365/207
(58) Field of Classification Search ......... 365/185.21, 365/210, 207, 189.07, 208, 185.2, 104, 191
See application file for complete search history.

(56) References Cited

U.S. PATENT DOCUMENTS

| 5,508,660 | A  | * | 4/1996 | Gersbach et al. ............... 331/17 |
| 6,563,737 | B2 | * | 5/2003 | Khouri et al. ............ 365/185.21 |
| 7,522,463 | B2 |   | 4/2009 | Pelli et al. |
| 2002/0101775 | A1 | | 8/2002 | Nojiri et al. |

* cited by examiner

*Primary Examiner* — Dang Nguyen
(74) *Attorney, Agent, or Firm* — Thomas|Kayden

(57) ABSTRACT

A sense amplifying method, applied in a memory having a memory cell and a reference cell, includes: charging the memory cell and the reference cell to have a cell current and a reference current, respectively; duplicating the cell current and the reference current to respectively generate a mirrored cell current via a first current path and a mirrored reference current via a second current path and equalizing a first voltage drop generated as the mirrored cell current flows by the first current path and a second voltage drop generated as the mirrored reference current flows by the second current path; and removing the equalization of the first voltage drop and the second voltage drop and adjusting first voltage drop and the second voltage drop according to a first current flowing by the first current path and a second current flowing by the second current path.

7 Claims, 6 Drawing Sheets and currents Icell' and Iref' in FIG. 1B.
CURRENT-MODE SENSE AMPLIFYING METHOD This application is a divisional application of co-pending U.S. application Ser. No. 11/970,545, filed Jan. 8, 2008.

BACKGROUND OF THE INVENTION

1. Field of the Invention

The invention relates in general to a current-mode sense amplifying method, and more particularly to a low-power current-mode sense amplifying method suitable for flash memory.

2. Description of the Related Art

FIG. 1A is a block diagram of a conventional current-mode sense amplifier applied in a flash memory. As shown in FIG. 1A, a conventional current-mode sense amplifier 100 includes a first current mirror 102, a second current mirror 104, an amplifying circuit 106 and an output stage circuit 108. The first current mirror 102 is for outputting a cell current Icell to a memory cell 110 and generating a mirrored cell current Icell' according to the cell current Icell, while the second current mirror 104 is for outputting a reference current Iref to a reference cell 120 and generating a mirrored reference current Iref' according to the reference current Iref.

Moreover, the amplifying circuit 106 is coupled to the first current mirror 102 and the second current mirror 104 for receiving the mirrored cell current Icell' and receiving the mirrored reference current Iref'. The output stage circuit 108 is coupled to the amplifying circuit 106 for outputting an output signal OUT.

FIG. 1B is a conventional circuit diagram of the amplifying circuit 106 of FIG. 1A. As shown in FIG. 1B, the amplifying circuit 106 includes P-type metal oxide semiconductor (PMOS) transistors P1 and P2, and N-type metal oxide semiconductor (NMOS) transistors N1~N6. The transistors P1, N1 and N2 are coupled in series and the transistors P1, N1 and N2 are coupled in series between the voltage VDD and a drain of the transistor N6. The source of the transistor N1 is for receiving the mirrored cell current Icell' and the source of the transistor N3 is for receiving the mirrored reference current Iref'. The transistor N5 is coupled between the transistors N1 and N3, and controlled by a first clock CLK1. The transistor N6 is controlled by a second clock CLK2.

Conventionally, as shown in FIG. 1C, in a charging period t1, the transistors N5 and N6 are respectively turned on by the clocks CLK1 and CLK2, both having a high level. The memory cell 110 and the reference cell 120 are respectively charged by large cell and reference currents Icell and Iref (charging currents), meanwhile a large mirrored cell current Icell' is generated to flow through the transistors N2 and N6 to the ground voltage GND and a large mirrored reference current Iref' is generated to flow through the transistors N4 and N6 to GND. Then, in the period t2, the transistor N5 is turned off by the first clock CLK1 and the transistor N2 maintains turned on by the second clock CLK2. The drain voltages V1 and V3 of the transistors N1 and N3 are adjusted to the voltage VDD or GND according to a current I2 flowing by the transistor N2 corresponding to the stable current Icell' and a current I4 flowing by the transistor N4 corresponding to the stable current Iref' as shown in FIG. 1B. Finally, the output stage circuit 108 outputs the signal OUT (1/0) according to the adjusted voltages V1 and V3.

However, the conventional current-mode sense amplifier has the following advantages:

(1) Large charging currents respectively flowing through the transistors N2, N6 and N4, N6 to GND in the charging period t1 lead to extra current (or power) consumption before the period t2 is reached when the mirrored cell current Icell' and mirrored reference current Iref' are stable enough. A great amount of power will be wasted as a large number of sense amplifiers are used in the flash memory.

(2) Due to MOSFET mismatch between transistors P1, N1, N2 and P2, N3, N4, the above-mentioned currents I2 and I4, such as 10 uA to 100 uA, may have an error current about tenth of the currents I2 and I4, such as 1 uA to 10 uA. The larger the operational voltage VDD (2.5V~3.7V) is, the larger the error current becomes. Therefore, the conventional current-mode amplifier 100 must maintain large current difference between Icell and Iref to combat with the error current generated from MOSFET offset. As the flash memory is designed to be smaller, the current difference between Icell and Iref becomes smaller. As soon as the error current is larger than the current difference between Icell and Iref, the current-mode sense amplifier 100 will malfunction.

SUMMARY OF THE INVENTION

According to an aspect of the present invention, a sense amplifying method is provided. The sense amplifying method is applied in a memory, and the memory comprises a memory cell and a reference cell. The sense amplifying method comprises respectively charging the memory cell and the reference cell to have stable cell current and reference current; duplicating the cell current and the reference current to respectively generate a mirrored cell current via a first current path and a mirrored reference current via a second current path and equalizing a first voltage drop generated as the mirrored cell current flows by the first current path and a second voltage drop generated as the mirrored reference current flows by the second current path; and removing the equalization of the first voltage drop and the second voltage drop and amplifying a voltage difference between the first voltage drop and the second voltage drop according to a first current flowing by the first current path and a second current flowing by the second current path.

The invention will become apparent from the following detailed description of the preferred but non-limiting embodiments. The following description is made with reference to the accompanying drawings.

DETAILED DESCRIPTION OF THE INVENTION

Figure 1A:
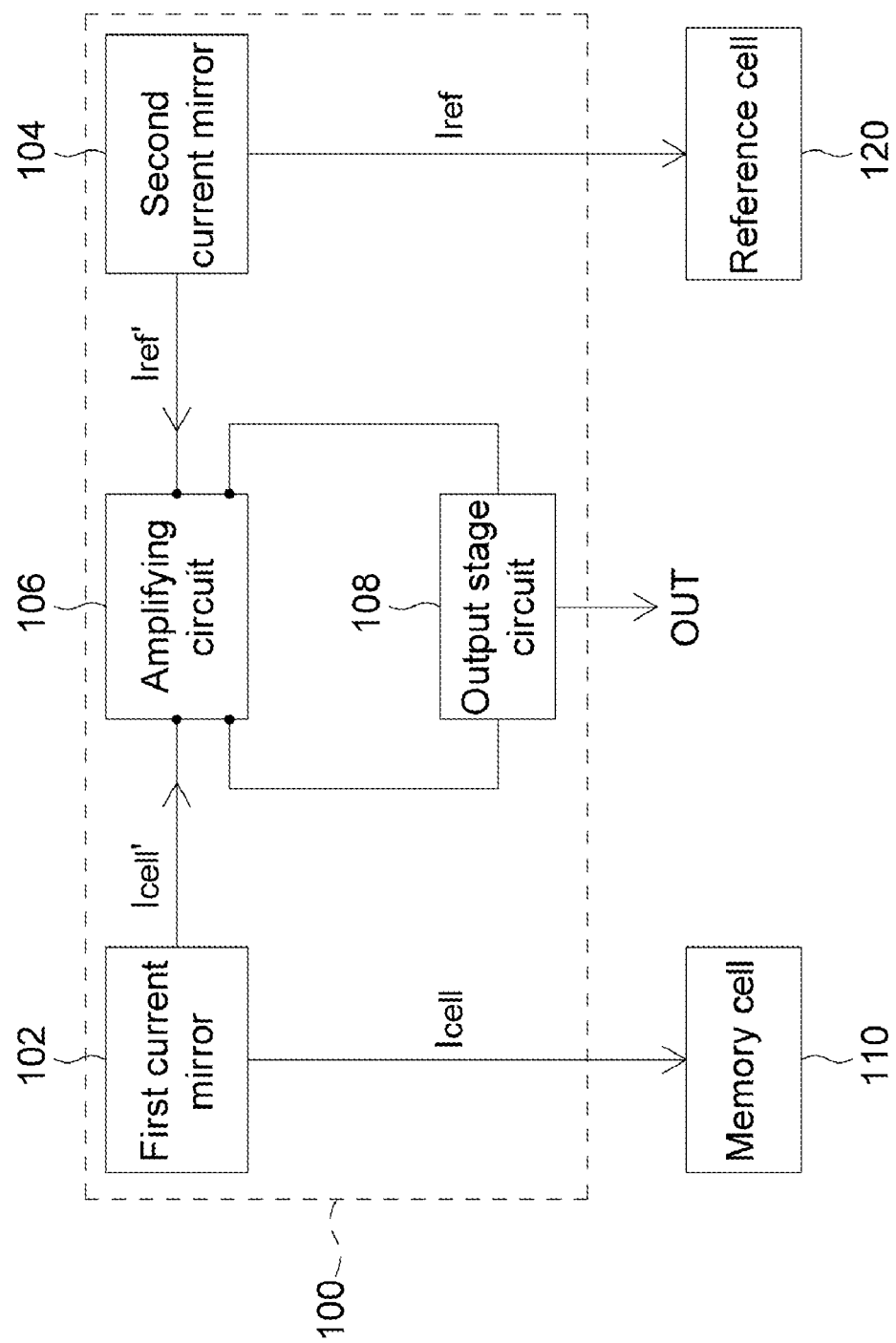
FIG. 1A is a block diagram of a conventional current-mode sense amplifier applied in a flash memory.
Figure 1B:
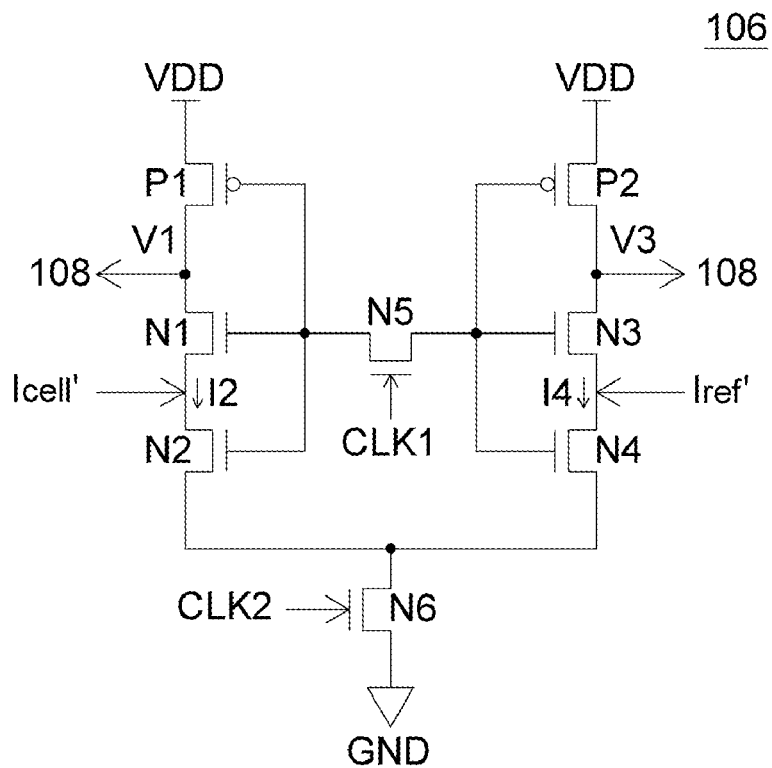
FIG. 1B is a conventional circuit diagram of the amplifying circuit of FIG. 1A.
Figure 1C:
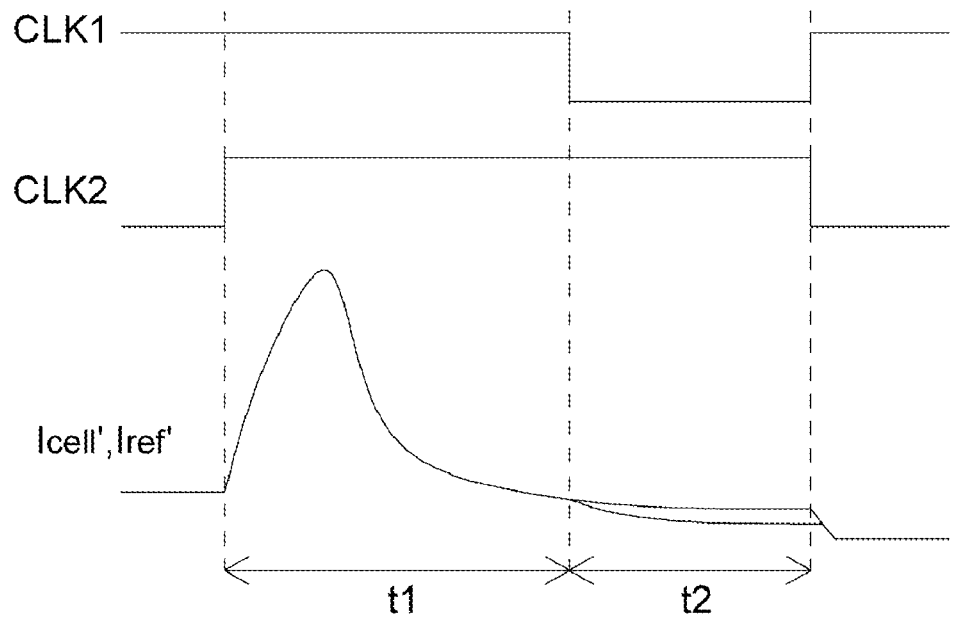
FIG. 1C is a timing diagram of the clocks CLK1 and CLK2 and currents Icell' and Iref' in FIG. 1B.
Figure 2:
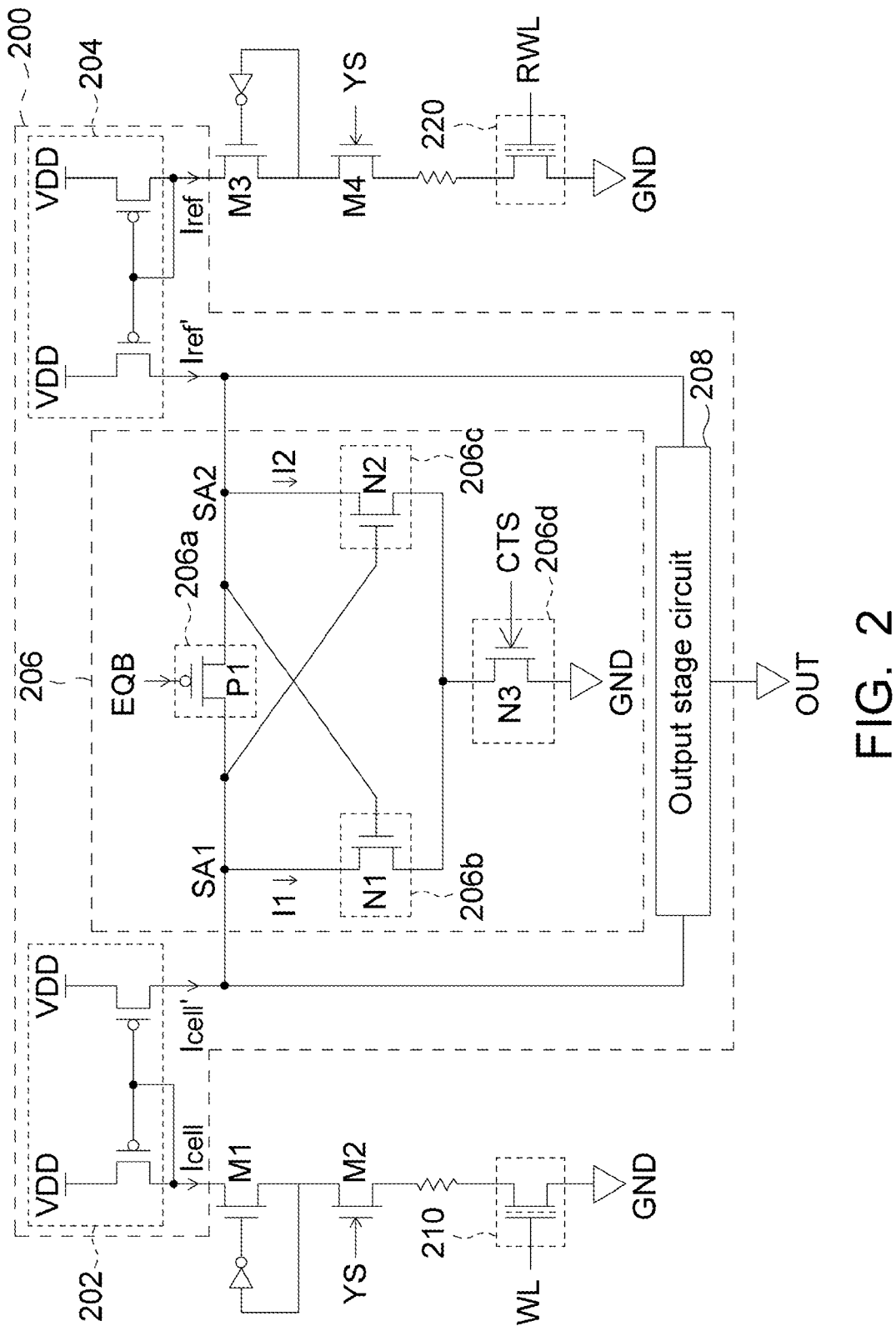
FIG. 2 is a circuit diagram of a current-mode sense amplifier according to a preferred embodiment of the invention.

Referring to FIG. 2, a circuit diagram of a current-mode sense amplifier according to a preferred embodiment of the invention is shown. A current-mode sense amplifier 200 is applied in a memory, such as a nonvolatile flash memory. The memory includes a memory cell 210 and a reference cell 220. The current-mode sense amplifier 200 includes a first current mirror 202, a second current mirror 204, an amplifying circuit 206 and an output stage circuit 208. The first current mirror 202 is for outputting a cell current Icell to the memory cell 210 via NMOS transistors M1 and M2 according to a first operational voltage VDD, and duplicating the cell current Icell to generate a mirrored cell current Icell'. The second current mirror 204 is for outputting a reference current Iref to the reference cell 220 via NMOS transistors M3 and M4 according to a first operational voltage VDD, and duplicating the reference current Iref to generate a mirrored reference current Iref'.

Moreover, the amplifying circuit 206 is coupled to the first current mirror 202 and the second current mirror 204. The amplifying circuit 206 includes a first switch 206a, a second switch 206b, a third switch 206c, and a fourth switch 206d. In the embodiment, the first switch 206a is implemented by a PMOS transistor P1, the second switch 206b is implemented by a NMOS transistor N1, the third switch 206c is implemented by a NMOS transistor N2, and the fourth switch 206d is implemented by a NMOS transistor N3. However, the invention is not limited thereto.

The transistor P1 includes a source for receiving the mirrored cell current Icell', a drain for receiving the mirrored reference current Iref', and a gate for receiving a first control signal EQB. The transistor N1 includes a drain coupled to the source of the transistor P1, and a gate coupled to the drain of the transistor P1. The transistor N2 includes a drain coupled to the drain of the transistor P1, and a gate coupled to the source of the transistor P1. The transistor N3 includes a drain coupled to sources of the transistors N1 and N2, a gate for receiving a second control signal CTS and a source coupled to a second operational voltage, such as GND. Besides, the output stage circuit 208 is coupled to the first current mirror 202 and the second current mirror 204 for outputting a binary digital value (1/0) according to the source voltage SA1 and the drain voltage SA2 of the transistor P1.

Figure 3:
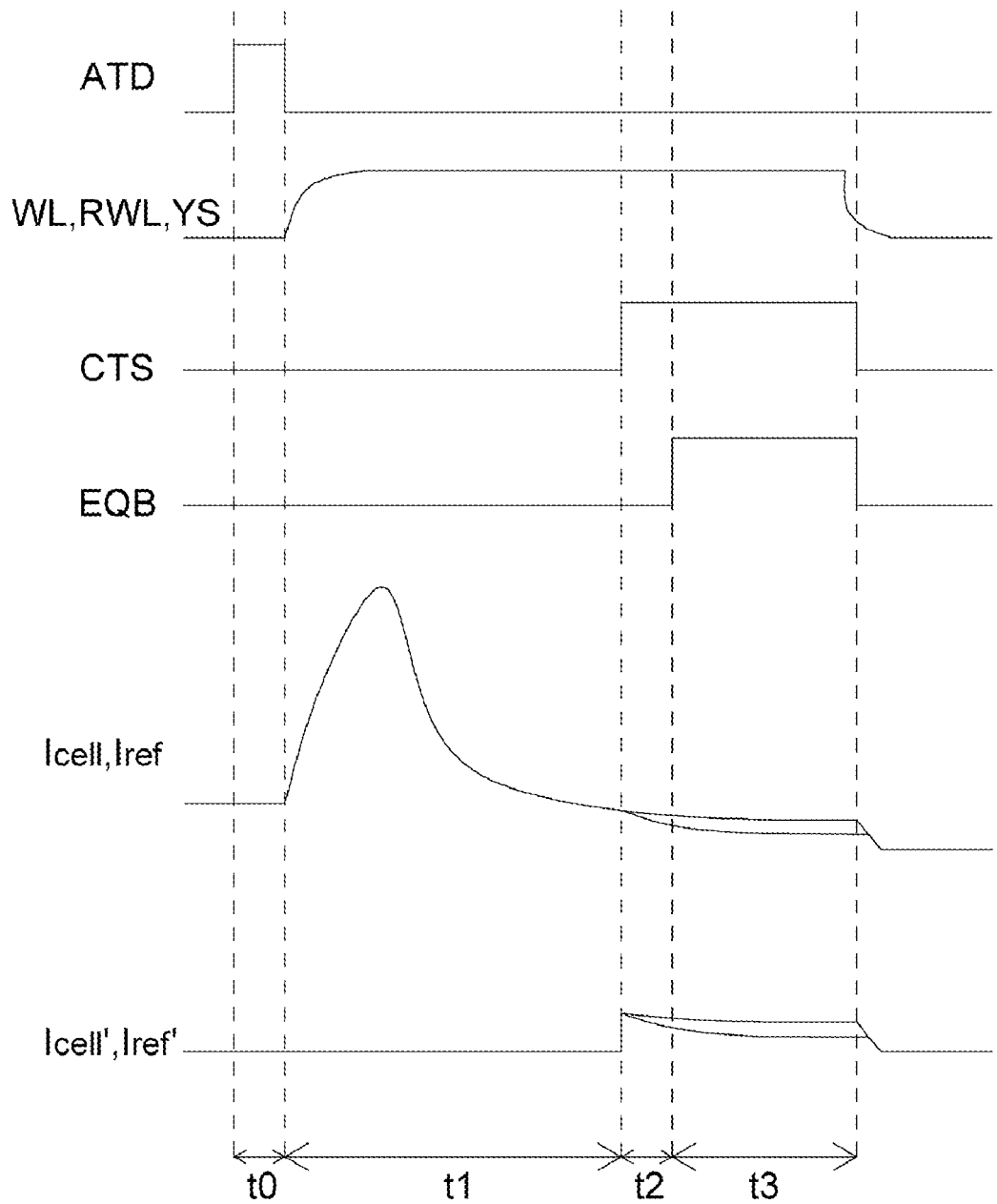
FIG. 3 is a timing diagram of control signals WL, RWL, YS, CTS, EQB and the cell current Icell, the reference current Iref, the mirrored cell current Icell' and the mirrored reference current Iref' in FIG. 2.

Referring to FIG. 3, a timing diagram of control signals WL, RWL, YS, CTS, EQB and the cell current Icell, the reference current Iref, the mirrored cell current Icell' and the mirrored reference current Iref' in FIG. 2 is shown. In an initial period t0 for address transition detection (ATD), the control signal WL of the memory cell 210, the control signal RWL of the reference cell 220 and the control signal YS of the transistors M2 and M3 are all at a low level, such as 0V, and the first control signal EQB and the second control signal CTS are also at the low level. At the time, the transistors P1 and N1~N3 are all turned off, and none of the cell current Icell, reference current Iref, mirrored cell current Icell' and mirrored reference current Iref' are generated.

Next, in a first timing period t1, the control signals WL, RWL and YS are changed from the low level to a high level, such as VDD, and the first control signal EQB and the second control signal CTS are maintained at the low level. Accordingly, the transistors M1, M2, M3 and M4 are all turned on, the transistors N1~N3 maintain at the off state, and the transistor P1 is turned on to equalize the source voltage SA1 and the drain voltage SA2. The output stage circuit 208 is also turned off. At the time, the memory cell 210 and the reference cell 220 are respectively charged by charging currents from the first current mirror 202 and the second current mirror 204 to have a cell current Icell and a reference current Iref, increasing abruptly and decreasing to a stable level until the following period t2 as shown in FIG. 3. The source voltage SA1 and drain voltage SA2 of the transistor P1 are approximately equal to the first operational voltage VDD of the first current mirror 202 and the second current mirror 204 as shown in FIG. 4.

One feature of the sense amplifier 200 in the embodiment lies in that in the first timing period t1, no current (Icell' and Iref') will be wasted through the transistors P1 and N1~N3 of the amplifying circuit 206 since the transistors N1~N3 are all turned off and the transistor P1 is turned on to equalize the source voltage SA1 and SA2. Consequently, the extra large power consumption in the charging period of the prior art can be prevented.

Following that, in a second timing period t2, the control signals WL, RWL and YS maintain at the high level, the first control signal EQB maintains at the low level, and the second control signal CTS is changed from the low level to the high level. Accordingly, the transistors M1~M4 maintain at the on state, the transistors P1 and N3 are both turned on to turn on the transistors N1 and N2. The output stage circuit 208 maintains at the off state. At the time, the first current mirror 202 and the second current mirror 204 maintain supplying stable cell current Icell and reference current Iref to the memory cell 210 and the reference cell 220, respectively. Simultaneously, the stable mirrored current Icell' flows through a first current path from the turned-on transistor N1 to the second operational voltage (GND) through the turned-on transistor N3, and the stable mirrored current Iref' flows through a second current path from the turned-on transistor N2 to the second operational voltage (GND) through the turned-on transistor N3.

Figure 4:
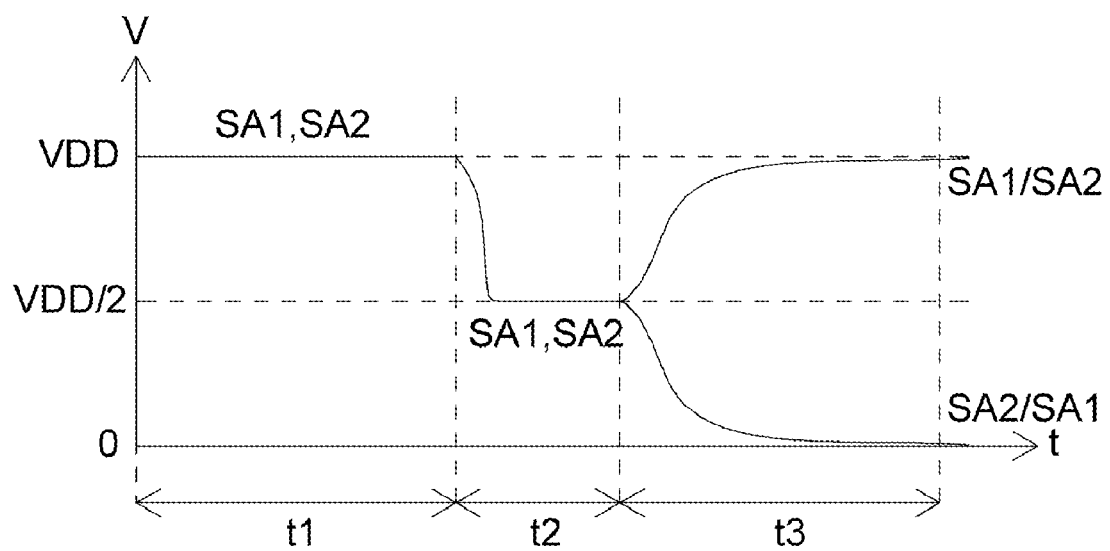
FIG. 4 is a curve diagram of the voltages SA1 and SA2 relative to time in the timing periods t1, t2 and t3 of FIG. 3.

Moreover, a first voltage drop generated as the current Icell' flows by the first current path, i.e. the source voltage SA1 of the transistor P1 and a second voltage drop generated as the current Iref' flows by the second current path, i.e. the drain voltage SA2 of the transistor P1 are equalized to approximately one half (VDD/2) of the first operational voltage VDD of the first current mirror 202 and the second current mirror 204 as shown in FIG. 4.

Afterward, in a third timing period t3, the control signals WL, RWL and YS maintain at the high level, the second control signal CTS maintains at the high level, and the first control signal EQB is changed from the low level to the high level. Accordingly, the transistors M1~M4 maintain at the on state, the transistor P1 is turned off, and the transistors N2 maintains at the on state. At the time, through the operation of the transistors N1 and N2 with one's gate being connected to the drain of the other, the first voltage drop, i.e. the source voltage SA1, and the second voltage drop, i.e. the drain voltage SA2, are adjusted to amplify their voltage difference with one of them increasing to the first operational voltage (VDD) and the other decreasing to the second operational voltage (GND) according to the first current I1 flowing by the transistor N1 and the second current I2 flowing by the transistor N2. The first current I1 is equal to the mirrored cell current Icell', and the second current I2 is equal to the mirrored reference current Iref'. Moreover, the output stage circuit 208 outputs the binary digital value (1/0) according to the adjusted first and second voltage drops (SA1 and SA2) in the third timing period t3.

Another feature of the sense amplifier 200 in the embodiment lies in that only four transistors P1 and N1~N3 are used to implement the amplifying circuit 206 as shown in FIG. 2, and thus the MOSFET mismatch between the transistors N1 and N2 is greatly reduced as compared to the prior art. Therefore, the error current of the currents I1 and I2 can be greatly reduced as compared to the prior art and the sensing accuracy of the sense amplifier 200 based on the currents I1 and I2 can be effectively increased.

Figure 5:
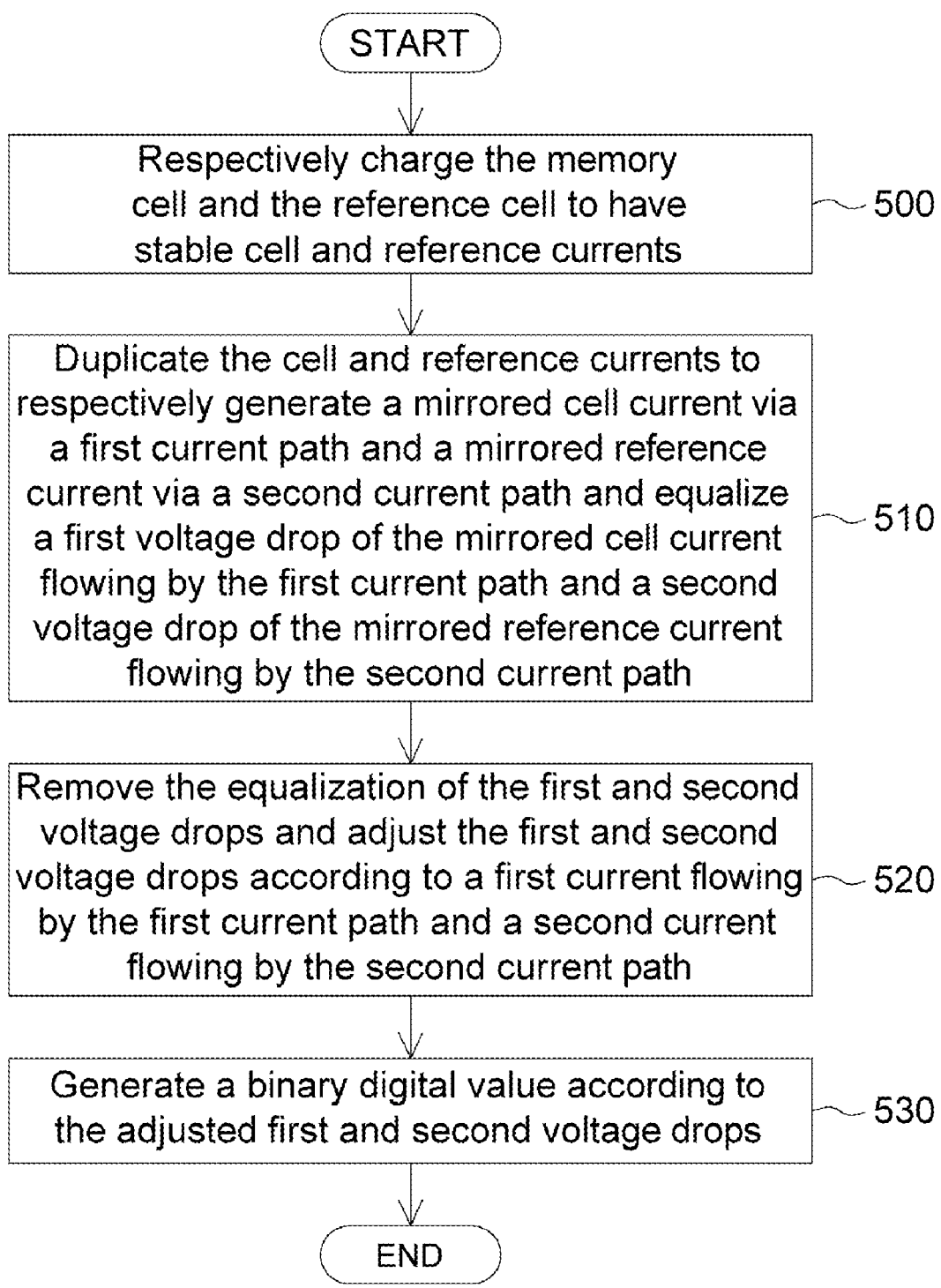
FIG. 5 is a flow chart of a sense amplifying method according to the preferred embodiment of the invention.

Referring to FIG. 5, a flow chart of a sense amplifying method according to the preferred embodiment of the invention is shown. First, in step 500, in the first timing period t1, respectively charge the memory cell 210 and the reference cell 220 to have stable cell current Icell and reference current Iref, such as by using the first current mirror 202 and the second current mirror 204 as shown in FIG. 2. The charging current profile of the cell current Icell and reference current Iref has an abrupt increase at the beginning and then a decrease to a relative stable level as shown in FIG. 3.

Following that, in step 510, in the second timing period t2, duplicate the cell current Icell and the reference current Iref to respectively generate a mirrored cell current Icell' and a mirrored reference current Iref' flowing from a first operational voltage (VDD) to a second operational voltage (GND), such as by using the first current mirror 202 and the second current mirror 204. Simultaneously, equalize a first voltage drop generated as the mirrored cell current Icell' flows by a first current path and a second voltage generated as the mirrored reference current Iref' flows by a second current path to be approximately one half of difference between the first operational voltage and the second operational voltage. For example, as shown in FIG. 2, the first current path is from the transistor N1 to the second operational voltage GND through the transistor N3, the second current path is from the transistor N2 to the second operational voltage GND through the transistor N3, and the first current path and the second current path are conducted by the turned-on transistor P1 to equalize the first voltage drop i.e. the source voltage SA1 and the second voltage drop i.e. the drain voltage SA2 to about VDD/2.

As shown in FIG. 3, the second timing period t2 is designed to be short relative to the first timing period t1 and the following third period t3. The purpose of the second timing period t2 is to reduce noise coupling of the current flowing by the transistors N1 and N2 in the third period t3.

Next, in step 520, in a third timing period t3, remove the equalization of the first voltage drop and the second voltage drop and adjust the first voltage drop and the second voltage drop to amplify their voltage difference according to a first current flowing by the first current path and a second current flowing by the second current path. For example, as shown in FIG. 2, the transistor P1 is turned off to remove the equalization of the first voltage drop i.e. the source voltage SA1 and the second voltage drop i.e. the drain voltage SA2. The first voltage drop and the second voltage drop are adjusted according to the first current I1 flowing by the transistor N1 and the second current I2 flowing by the transistor N2. At the time, the first current I1 is equal to the mirrored cell current Icell' and the second current I2 is equal to the mirrored reference current Iref'.

In the step 520, if the cell current Icell is larger than the reference current Iref, i.e. the mirrored cell current Icell' is larger than the mirrored reference current Iref', the first current flowing by the first current path (the current I1 flowing by the transistor N1) is larger than the second current flowing by the second current path (the current I2 flowing by the transistor N2). As a result, the first voltage drop (the source voltage SA1) is increased to approximately the first operational voltage (VDD) and the second voltage drop (the drain voltage SA2) is decreased to the second operational voltage (GND) as shown in FIG. 4.

Conversely, if the cell current Icell is smaller than the reference current Iref, i.e. the mirrored cell current Icell' is smaller than the mirrored reference current Iref', the first current flowing by the first current path (the current I1 flowing by the transistor N1) is smaller than the second current flowing by the second current path (the current I2 flowing by the transistor N2). As a result, the first voltage drop (the source voltage SA1) is decreased to the second operational voltage (GND) and the second voltage drop (the drain voltage SA2) is increased to approximately the first operational voltage (VDD) as shown in FIG. 4.

Finally, in step 530, generate a binary digital value according to the adjusted first voltage and second voltage in the third timing period t3. For example, as shown in FIG. 2, the output stage circuit 208 is turned on to output the signal OUT (1/0) according to the adjusted source voltage SA1 and drain voltage SA2. If the voltage SA1 is larger than SA2, the signal OUT is "1" and if the voltage SA1 is smaller than SA2, the signal OUT is "0".

The current-mode sense amplifier and sense amplifying method disclosed by the embodiment of the invention has the following advantages:

(1) Compared to the prior art consuming large current through the sense amplifier in the charging period, the sense amplifier 200 can reduce power consumption in the charging period for the memory cell by switching off the transistor N3 of the amplifying circuit 206 since no current flows by the amplifying circuit 260.

(2) By providing an amplifying circuit 206 having a smaller number of transistors without connecting to the operational voltage VDD as in the prior art, the MOSFET mismatch between the transistors on the first current path and the transistors on the second current path can be reduced because we remove the error current generated from the mismatch of two PMOS in circuit 206 under the variation of VDD. Thus, the error current between the current flowing by the first current path and the current flowing by the second current path is not dependent on the variation of the operational voltage and can be greatly reduced. Therefore, the prior-art issue of malfunction of the current-mode sense amplifier as the flash memory is designed to be smaller can be effectively improved, and the sensing accuracy of the sense amplifier and sense amplifying method of the invention can be effectively increased.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A sense amplifying method, applied in a memory, the memory comprising a memory cell and a reference cell, the sense amplifying method comprising:

charging the memory cell and the reference cell to have a stable cell current and a stable reference current, respectively;

duplicating the cell current and the reference current to respectively generate a mirrored cell current via a first current path and a mirrored reference current via a second current path and equalizing a first voltage drop generated as the mirrored cell current flows by the first current path and a second voltage drop generated as the mirrored reference current flows by the second current path; and removing the equalization of the first voltage drop and the second voltage drop and adjusting the first voltage drop and the second voltage drop according to a first current flowing by the first current path and a second current flowing by the second current path.

2. The sense amplifying method according to claim 1, wherein the charging step is performed in a first timing period, the duplicating step is performed in a second timing period, and the removing step is performed in a third timing period.

3. The sense amplifying method according to claim 2, wherein the second timing period is short relative to the first timing period and the third timing period.

4. The sense amplifying method according to claim 2, wherein in the second timing period, the mirrored cell current and the mirrored reference current respectively flow through the first current path and the second current path from a first operational voltage to a second operational voltage, and the first voltage drop and the second voltage drop are equalized to be approximately equal to one half of a voltage difference between the first operational voltage and the second operational voltage.

5. The sense amplifying method according to claim 4, wherein in the third timing period, the mirrored cell current is equal to the first current, and the mirrored reference current is equal to the second current.

6. The sense amplifying method according to claim 5, wherein the step of adjusting the first voltage drop and the second voltage drop further comprises:

adjusting the first voltage drop to the first operational voltage and the second voltage drop to the second operational voltage if the first current is larger than the second current; and adjusting the first voltage drop to the second operational voltage and the second voltage drop to the first operational voltage if the first current is smaller than the second current.

7. The sense amplifying method according to claim 6, further comprising generating a binary digital value according to the adjusted first voltage drop and second voltage drop in the third timing period.

* * * * *